United States Patent [19]

Morgan et al.

[11] Patent Number: 5,674,566
[45] Date of Patent: Oct. 7, 1997

[54] PROCESS AND DEVICE FOR PROCESSING PLATE-LIKE WORKPIECES

[76] Inventors: Russell Morgan, 1350 Middle Ave., Menlo Park, Calif. 94025; Thomas Bächtle, Obere Linde 24, D-72525 Münsingen, Germany

[21] Appl. No.: 530,236
[22] PCT Filed: Feb. 10, 1994
[86] PCT No.: PCT/DE94/00412
 § 371 Date: Dec. 15, 1995
 § 102(e) Date: Dec. 15, 1995
[87] PCT Pub. No.: WO95/22084
 PCT Pub. Date: Aug. 17, 1995
[51] Int. Cl.$^6$ .................. B65D 1/42; B65C 1/02
[52] U.S. Cl. .................. 427/355; 427/431; 427/430.1; 118/200; 118/204; 118/242; 118/407
[58] Field of Search .................. 427/355, 430.1, 427/421; 418/56; 118/200, 242, 407, 204

[56] References Cited

U.S. PATENT DOCUMENTS 3,369,918  2/1968  Young ..................  117/37
4,770,836  9/1988  Vetter et al. .
5,069,156  12/1991  Suzuki ..................  118/52
5,545,440  8/1996  Thornberg ..................  427/430.1

FOREIGN PATENT DOCUMENTS 0075151  3/1983  European Pat. Off. .
0481088  4/1992  European Pat. Off. ..............  118/200
47194  2/1988  Japan ..................  427/355

*Primary Examiner*—Shrive P. Beck
*Assistant Examiner*—Bret Chen
*Attorney, Agent, or Firm*—Paul J. Vincent

[57] ABSTRACT

The proposal is for a process and device for machining plate-like workpieces, especially silicon wafers or glass masks by coating the surface with a liquid, making use of capillary forces to distribute the liquid over the surface. To this end, a narrow slit is formed in which capillary forces act on the liquid. Features of the process are low liquid consumption and insensitivity to soiling.

11 Claims, 2 Drawing Sheets

PROCESS AND DEVICE FOR PROCESSING PLATE-LIKE WORKPIECES

BACKGROUND OF THE INVENTION

The invention concerns a method according to the preamble of the main claim and an apparatus according ti the preamble of claim 6. The processing of plate-like workpieces, in particular, silicon wafers or glass plates by introducing a fluid onto the surface of the workpiece is well known in the art. Fluid is introduced, for example, by dipping the workpiece into the fluid. Another method of introducing the fluid is to attach the workpiece to a rotatable plate and to drip or spray the fluid. The fluid is then distributed on the surface through the rotation of the workpiece or, by means of a very rapid rotation at the end of the processing, is accelerated off of the surface of the workpiece. When dipping there is the danger, that impurities can accumulate in the dipping solution. In the acceleration method there are large mechanical forces on the surface of the workpiece. In both methods only a small fraction of the fluid is utilized for the processing of the workpiece. Known in the art from the English language abstracts of JP 1-183120 and JP 1-164036 are methods with which a fluid is arranged between the surface of a workpiece and a working area. The distribution of the fluid, however, does not take place by means of capillary action.

SUMMARY OF THE INVENTION

The invention concerns a method for the processing of plate-like workpieces, in particular silicon wafers or glass plates with which the surface of the workpiece is coated with at least one fluid, characterized in that the surface of the workpiece is brought into a location facing at least one working area which is not wettable by the fluid so that a gap forms and the surface of the workpiece is brought into contact with the fluid and the gap between the surface and the working area is sufficiently small that the fluid is distributed by means of capillary action on the surface, the working area facing in the upward direction and the surface facing in the lower direction, and the fluid is introduced onto the working area and the surface is brought into contact with the fluid by means of a substantially parallel motion of the workpiece with respect to the working area.

In an embodiment of the invention, following a predetermined time subsequent to the distribution on the surface, the liquid is removed from the surface aside from the layer bonded to the surface.

In an improvement of this embodiment, the working area exhibits an edge and the liquid is removed in that the workpiece is moved out over and beyond the edge by means of a motion which is largely parallel to the working area.

In a variation of this improvement, the liquid is a photosensitive resist and the thickness of the layer which remains on the surface is adjusted by means of the viscosity and the wetting characteristics of the photosensitive resist as well as the velocity of motion of the workpiece.

In another variation of the above embodiment, the liquid is water or a watery solution and the surface is coated, after removal of the fluid, with a water-soluble spray whose wettability is larger than the wettability of water.

The invention also concerns an apparatus for the processing of plate-like workpieces, in particular of silicon wafers or glass plates, with means for coating the surface of the plate-like workpieces with at least one fluid, characterized in that the means for coating the surface comprise at least one working area which is not wettable by the fluid, positioning means and delivery means for the fluid, a small gap being adjustable between the surface and the working area by means of the positioning means, and the liquid can be introduced by means of the delivery means in such a fashion that the fluid in the gap comes in contact with the surface, the working area facing in the upward direction and, via the delivery means, a predetermined amount of fluid can be introduced to the working area, the workpiece being displaceable largely parallel to the working area by means of the positioning means.

In an embodiment of the apparatus in accordance with the invention, the working area exhibits an edge and the workpiece is displaceable over the edge.

In an improvement of this embodiment, various fluids can be introduced to the working area by means of the delivery means.

In another improvement, a plurality of working areas with edges are arranged in such a fashion that all working areas can be traversed by a linear motion of the workpiece.

The method and device in accordance with the invention have the advantage that the introduction of the fluid takes place in a particularly careful fashion, the danger of contamination of the fluid is particularly low, and only a small quantity of fluid must be utilized for the processing. It is particularly simple to introduce the fluid onto the upwardly facing working area. In the event that contact is established with a downwardly facing surface, a soiling of the surface by means of falling dust particles is avoided. In the event that contact is established by a substantially parallel motion with respect to the working area, it is possible to control the width of the gap particularly well and the distribution of the fluid on the surface is particularly well reproducible.

Advantageous improvements and embellishments of the method and apparatus according to the invention are possible. By removing the fluid after a predetermined time following the distribution on the surface, it is possible to control the processing of the workpiece particularly well. The removal from the surface takes place in a particularly simple fashion in that the workpiece is moved out over the edge of the working area. In this fashion the removal of a fluid takes place in a particularly reproducible fashion. In this manner, in particular, photosensitive resist layers can be introduced onto the surface with particularly simple means. With watery liquids, particularly good removal of the water from the surface can be achieved by means of coating with a water-soluble spray. Particularly simple apparatuses for the coating of the surface with different fluids are realized in that different fluids can be introduced onto a working area having an edge over and beyond which the workpiece can be displaced. By means of the linear configuration of a plurality of working areas upon which different fluids can be introduced, devices are created which facilitate a particularly rapid processing of the workpieces.

DESCRIPTION OF THE PREFERRED EMBODIMENT

Figure 1:
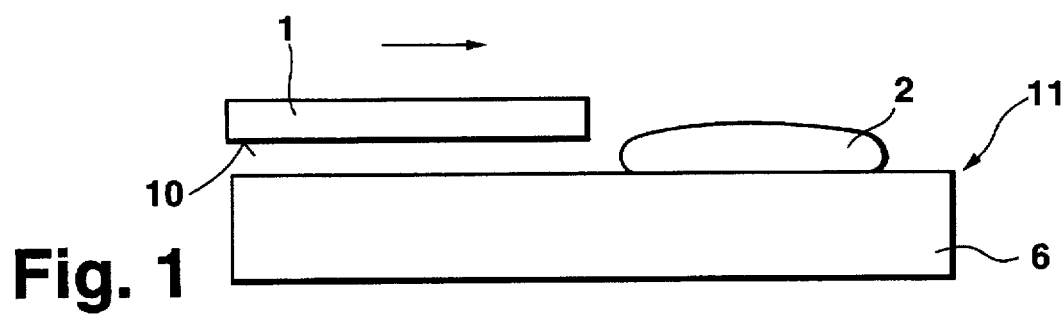
FIG. 1 shows the method and apparatus in accordance with the invention wherein a workpiece is moved in the direction of the arrow from left to right.

FIG. 1 shows the method and apparatus in accordance with the invention wherein a workpiece 1 is moved in the direction of the arrow from left to right prior to engagement between the lower surface 10 of the workpiece 1 and a fluid 2 deposited on a working area 6.

Figure 2:
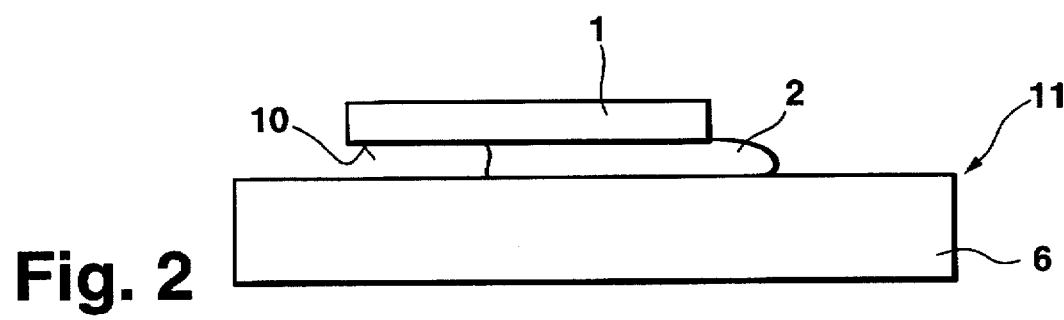
FIG. 2 shows the situation of FIG. 1 subsequent to contact between the workpiece and the fluid.

FIG. 2 shows the situation of FIG. 1 in accordance with the invention but subsequent to contact between the lower surface 10 of the workpiece 1 and the fluid 2. The workpiece 1 has moved substantially parallel to the upper surface of the working area 6 and the gap between the lower surface 10 and the upper surface of the working area 6 is sufficiently small that capillary action forces distort the left edge of the fluid 2, drawing the fluid into the gap and distributing the fluid 2 on the surface 10.

Figure 3:
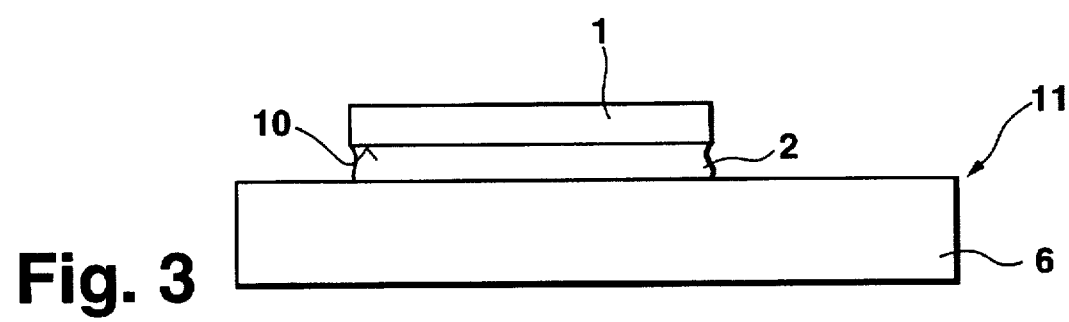
FIG. 3 shows the fluid travelled due to capillary forces.

In FIG. 3 the relative position between the workpiece 1 and the working area 6 remains unchanged compared to FIG. 2, but the fluid 2 has travelled due to capillary forces to cover the surface 10. The left-right symmetric and outward bulging edges of the fluid 2 in FIG. 3 indicate that, in this position, the fluid is largely stationary relative to the working surface 10 and the upper surface of the working area.

Figure 4:
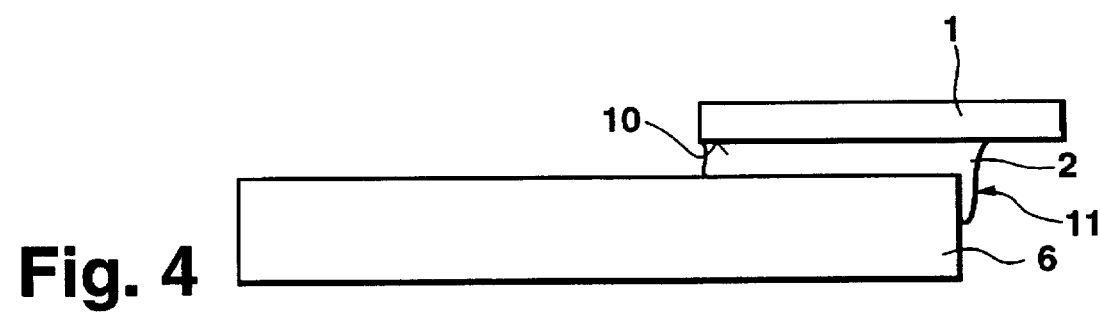
FIG. 4 illustrates removal of the fluid at the edge of the working area.

FIG. 4 illustrates removal of the fluid 2 by positioning the workpiece 1 over and beyond the edge 11 of the working area 6.

Figure 5:
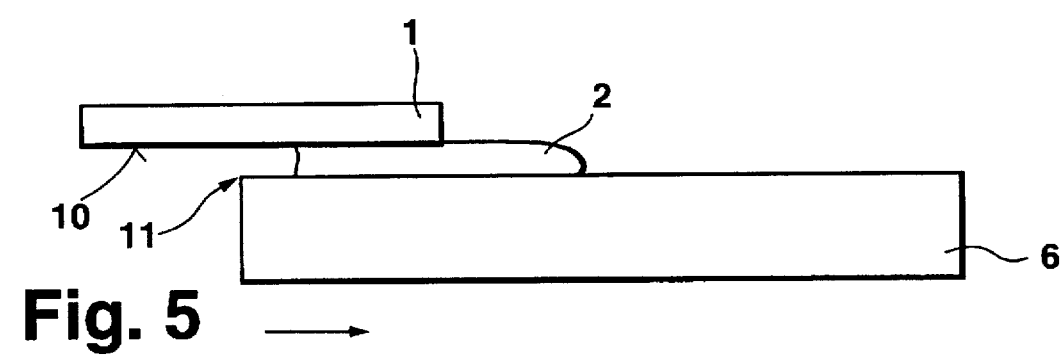
FIG. 5 shows removal via the left edge of the working area.

As illustrated in FIG. 5, such removal is also possible via the left edge 11 of the upper surface of the working area 6 by movement of the working area 6 in the direction of the arrow.

Figure 6:
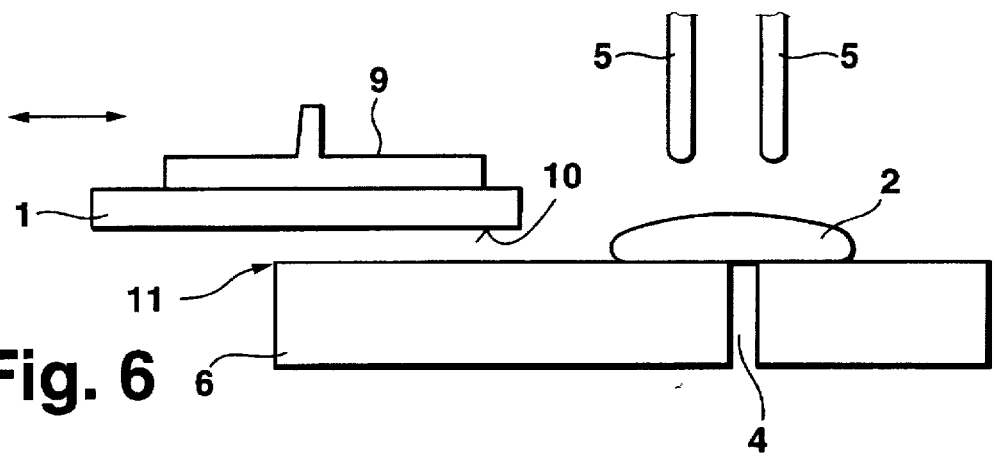
FIG. 6 shows movement of the workpiece with positioning means and introducing fluid with delivery means.

In FIG. 6 movement of workpiece 1 to either the right or left directions of the arrows is facilitated with positioning means 9. The fluid 2 is introduced to the upper surface of the working area 6 either through delivery means 5 or 4.

Figure 7:
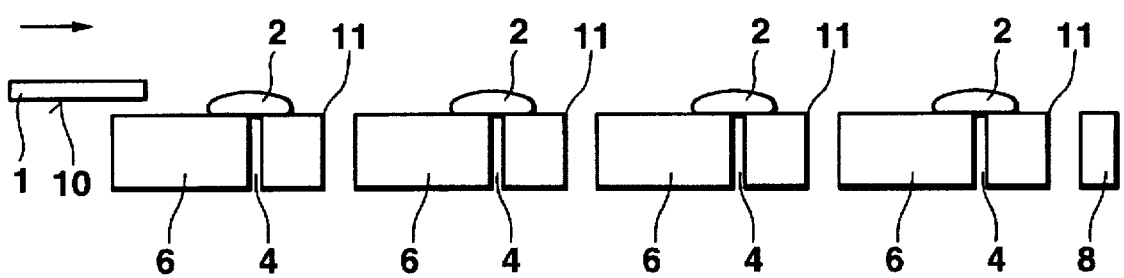
FIG. 7 shows subjecting the workpiece to a series of coatings.

In FIG. 7 the surface 10 of the workpiece 1 is subjected to a series of coatings through movement across a plurality of working areas 6 with a plurality of fluids 2, edges 11 and delivery means 4.

Figure 8:
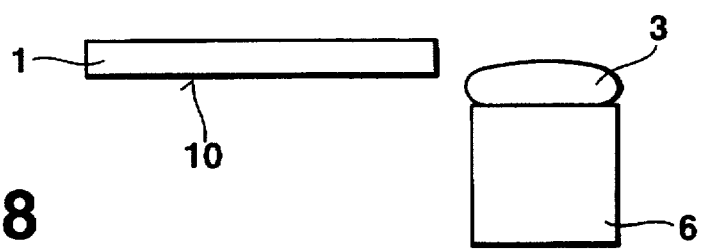
FIG. 8 shows a short length of the working area.

FIG. 8 shows a situation in which the length of the surface 10 of the workpiece 1 which is to be covered is substantially less than that of the working area 6 upon which a fluid 3 is located.

Figure 9:
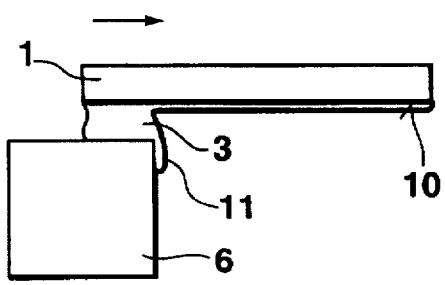
FIG. 9 shows removal of the fluid over the edge of the working area.

In FIG. 9 the fluid 3 of FIG. 8 is removed from the surface 10 of the workpiece 1 with the exception of a thin layer 10 through movement of the workpiece 1 over the edge 11 of the working area 6.

We claim:

1. A method for applying at least one fluid to a surface of a plate object comprising the steps of:
   introducing the fluid onto an upper surface of a substrate, said upper surface not wetted by the fluid;
   positioning the plate object with a lower surface of the plate object forming a gap with the upper substrate surface to distribute the fluid across the lower surface of the plate object by capillary action; and
   moving the plate object with respect to the substrate in a direction substantially parallel to the upper substrate surface to initiate contact between the lower surface of the plate object and the fluid, wherein the fluid is distributed across the lower surface of the plate object by capillary action.

2. The method of claim 1 further comprising the step of: removing fluid from the lower surface of the plate object.

3. The method of claim 2, wherein the substrate has an edge and fluid is removed by moving the plate object over and beyond the edge.

4. The method of claim 3, wherein the fluid is a photosensitive resist and a thickness of a fluid layer bonded to the lower object surface is adjusted by a velocity of motion of the plate object with respect to the upper substrate surface.

5. The method of claim 2, wherein the fluid is water or a watery solution and further comprising the step of applying a water-soluble spray to the lower surface of the plate object after removal of the fluid from the lower surface of the plate object, said spray having a wettability larger than a wettability of water.

6. The method of claim 1, wherein the plate object is one of a silicon wafer and a glass plate.

7. An apparatus for applying a fluid to a surface of a plate object comprising:
   a substrate having an upper surface not wetted by the fluid;
   delivery means for introducing a predetermined amount of the fluid onto the upper substrate surface; and
   positioning means for adjusting a gap between a lower surface of the plate object and an upper surface of the substrate and for displacing the plate object parallel to the upper substrate surface to contact the fluid in the gap with the lower surface of the plate object and for distributing the fluid across the lower surface of the plate object by capillary action.

8. The apparatus of claim 7, wherein the substrate has an edge and the positioning means displace the plate object over and beyond the edge to remove fluid from the lower surface of the plate object.

9. The apparatus of claim 8, wherein the delivery means introduce a plurality of fluids onto the substrate.

10. The apparatus of claim 8, wherein the substrate has a plurality of edges traversable by a linear movement of the plate object relative to the upper substrate surface.

11. The apparatus of claim 7, wherein the plate object is one of a silicon wafer and a glass plate.

* * * * *